(12) United States Patent
Eidson et al.

(10) Patent No.: US 6,242,975 B1
(45) Date of Patent: Jun. 5, 2001

(54) ENVELOPE PEAK AND TROUGH LIMITING TO IMPROVE AMPLIFIER EFFICIENCY AND DISTORTION CHARACTERISTICS

(75) Inventors: Donald Brian Eidson; Robert Edmund Grange, both of San Diego, CA (US)

(73) Assignee: Conexant Systems, Inc., Newport Beach, CA (US)

( * ) Notice: Subject to any disclaimer, the term of this patent is extended or adjusted under 35 U.S.C. 154(b) by 0 days.

(21) Appl. No.: 09/318,529

(22) Filed: May 25, 1999

(51) Int. Cl.[7] .................... H03F 3/68; H03F 1/02; H04K 1/02
(52) U.S. Cl. .................. 330/124 R; 330/149; 375/297
(58) Field of Search .................. 330/124 R, 129, 330/136, 149; 375/297

(56) References Cited

U.S. PATENT DOCUMENTS

| 4,291,777 | * | 9/1981 | Davis et al. ................ 330/149 |
| 4,462,001 | * | 7/1984 | Girard ........................ 330/149 |
| 4,965,527 | * | 10/1990 | Clark et al. ................. 330/124 R |
| 5,041,793 | * | 8/1991 | Gailus ........................ 330/129 |
| 5,043,673 | * | 8/1991 | Suematus et al. .......... 330/149 |
| 5,293,407 | * | 3/1994 | Shibata ...................... 375/60 |
| 5,621,762 | | 4/1997 | Miller et al. ................ 375/298 |
| 5,901,346 | * | 5/1999 | Stengel et al. ............. 330/129 |
| 5,905,760 | * | 5/1999 | Schnabl et al. ............ 375/297 |

OTHER PUBLICATIONS

Miller, et al., "Peak Power and Bandwidth Efficient Linear Modulation," IEEE Transactions on Communications, vol. 46, No. 12, Dec. 1998.

\* cited by examiner

*Primary Examiner*—Robert Pascal
*Assistant Examiner*—Khanh Van Nguyen
(74) *Attorney, Agent, or Firm*—Brinks Hofer Gilson & Lione

(57) ABSTRACT

The envelope of a non-constant envelope signal is limited to certain maximum and minimum values. An envelope value is calculated for each pair of I-Q samples of the non-constant envelope signal and then is compared to the maximum and minimum values. If the envelope value lies above or below the maximum and minimum values, the I and Q signals are scaled so that the envelope value lies between these values. In some embodiments, the threshold values are selected to ensure that the probability that the envelope value will exceed these values is less than a predetermined amount (e.g., between 0.01 and 0.001).

26 Claims, 10 Drawing Sheets

ENVELOPE PEAK AND TROUGH LIMITING TO IMPROVE AMPLIFIER EFFICIENCY AND DISTORTION CHARACTERISTICS

TECHNICAL FIELD

This invention relates to communication systems and, more particularly, to improving the efficiency of a power amplifier in a communication system.

BACKGROUND

Power amplifiers in communication systems, such as radio frequency (RF) systems, have limited dynamic ranges; operating at high output power levels leads to phase and amplitude distortion, while operating at reduced output power levels leads to system inefficiency (i.e., the ratio of the output RF power to the combined power from the DC power supply and the input signal is less than optimal). Power amplifiers also produce amplitude and phase distortion at higher input or output power levels. As a result, the efficiency of a power amplifier improves as the dynamic range of the amplified signal is reduced. In general, power amplifiers are most efficient in systems that rely on constant envelope modulation techniques.

Most modern wireless communication standards, including IS-95A, IS-136, and Personal Digital Cellular (PDC), use non-constant envelope modulation techniques. Signals in systems that follow these standards exhibit large dynamic ranges, with peak-to-average power values typically varying from as little as 2.9 dB to as great as 5.8 dB. Since the amplifier must be backed off to faithfully reproduce the peaks, the maximum efficiencies of power amplifiers designed for these systems typically range from 35% to 50%.

One technique for improving the performance (ie., efficiency and fidelity) of a power amplifier in a non-constant envelope environment is the envelope elimination and restoration (EER) technique described by Leonard R. Kahn in "Single-Sideband Transmission by Envelope Elimination and Restoration," Proceedings of the I.R.E., vol. 40, pp. 803–06 (1952). FIG. 1 shows a particular implementation of an envelope elimination and restoration amplifier 100 in which an amplitude limiter 102 and an envelope detector 104 are used to separate a low power RF signal 106 into two components: (1) a phase and frequency modulated (FM) signal 108 having a constant envelope and (2) a baseband signal 110 representing the non-constant envelope. A standard RF power amplifier 112 amplifies the constant envelope FM signal 108, and a envelope amplifier 114 amplifies the envelope signal 110. An envelope combining power amplifier 116 combines the amplified FM and envelope signals. A delay element 118 ensures proper timimg of the signals arriving at the envelope combiner 116. An example of this topology, known as the envelope feedforward amplifier, is described in detail in U.S. patent application Ser. No. 09/108,628, filed on Jul. 1, 1998, by Donald Brian Eidson and Robert Edmund Grange, and titled "Envelope Feedforward Technique with Power Control For Efficient Linear RF Power Amplification."

By breaking the RF signal into a constant envelope RF component and a baseband envelope component, this technique provides a great improvement in amplifier efficiency, yielding actual efficiencies of more than 70% in many systems. Nevertheless, communication systems that produce very large peak-to-average power variations, such as an IS-95B system with eight channels (>17dB variations), greatly reduce the efficiency of power amplifiers that use even this amplification technique. Moreover, many EER techniques cannot support high dynamic range signals and/or still provide additional range for average power adjustment (e.g., average power control in cellular systems).

SUMMARY

The inventors have discovered that the efficiency and linearity of all power amplifiers (PAs), including envelope following amplifiers such as envelope feedforward amplifiers, are improved by limiting the dynamic range of the envelope signal before injection into the PA. A particular concern is ensuring that the amplitude of the envelope signal remains below a maximum value. In addition, for envelope following PAs, one would also like to ensure that the envelope signal does not fall below a minimum value. In most situations, limiting the amplitude of the envelope signal to a relatively narrow range of values has little effect on signal fidelity (i.e., modulation accuracy) and spectral containment.

For example, an IS-95A standard signal for which envelope excursions are limited to no more than 6 dB below the average power level yields a theoretical modulation accuracy ($\rho$), in terms of correlation with an ideal signal, of greater than $1-10^{-4}$, and an adjacent channel power ratio (ACPR) of less than −59 dBc. Likewise, limiting IS-95A envelope excursions to peak values of no more than 3.9 dB yields a modulation accuracy ($\rho$) of greater $1-10^{-4}$ and ACPR of less than −60 dBc. These values for modulation accuracy and ACPR are very near the ideal values of $\rho=1$ and ACPR=−62 dBc. This is important because the actual peak-to-average ratio for IS-95A is greater than 5.5 dB, and the trough-to-average ratio is less than −22 dB. Moreover, the only distortion introduced by the amplifier is a certain amount of controlled amplitude distortion related to the envelope-limiting; virtually no phase distortion is introduced.

In one aspect, the invention involves limiting the envelope of a non-constant envelope signal when amplfying the signal. The signal is separated into two component signals, including a constant envelope signal containing phase and frequency information and a baseband signal representing the envelope. The envelope of the baseband signal is limited by confining the baseband signal to magnitudes lying either above or below a predetermined boundary value. At least one of the component signals is amplified, and then the magnitude-limited baseband signal and the constant envelope signal are combined to form an output signal having a limited but non-constant envelope.

In some embodiments, all portions of the baseband signal that lie above the boundary value are limited to the boundary value. In other embodiments, all portions of the baseband signal that lie below the boundary value are limited to the boundary value. One technique for implementing these embodiments involves receiving digital data that indicates an actual value of the baseband signal and, if the actual value is greater than or less than the boundary value, replacing the actual value with the boundary value. In other embodiments, digital signals representing in-phase and quadrature components of the non-constant envelope signal are used to calculate an envelope value for the baseband signal.

In another aspect, the invention involves receiving signals representing in-phase (I) and quadrature (Q) components of the non-constant envelope signal and, for at least one pair of samples in the I and Q signals, calculating an envelope value for the non-constant envelope signal. Each envelope value is compared to at least one threshold value and, if the envelope value exceeds the threshold value, the I and Q signals are scaled so that the envelope value does not exceed the threshold value. In some embodiments, the threshold value is selected to ensure that the probability that the envelope value will exceed the threshold value is less than a predetermined amount (e.g., between 0.01 and 0.001).

The details of one or more embodiments of the invention are set forth in the accompanying drawings and the description below. Other features, objects, and advantages of the invention will be apparent from the description and drawings, and from the claims.

DESCRIPTION OF DRAWINGS

Like reference numbers and designations in the various drawings indicate like elements.

DETAILED DESCRIPTION

Figure 1:
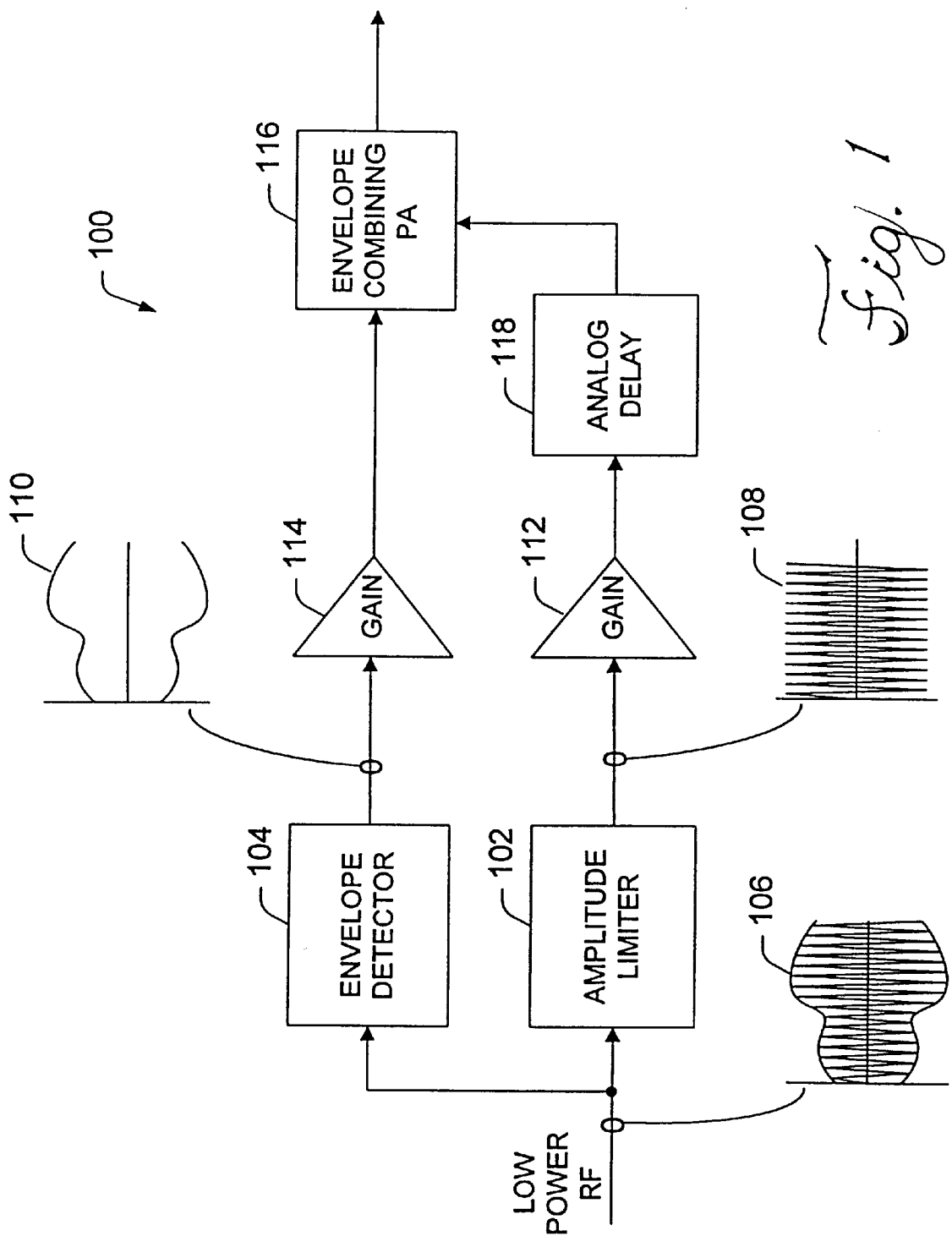
FIG. 1 shows a block diagram of an envelope elimination and restoration (EER) amplifier.
Figure 2:
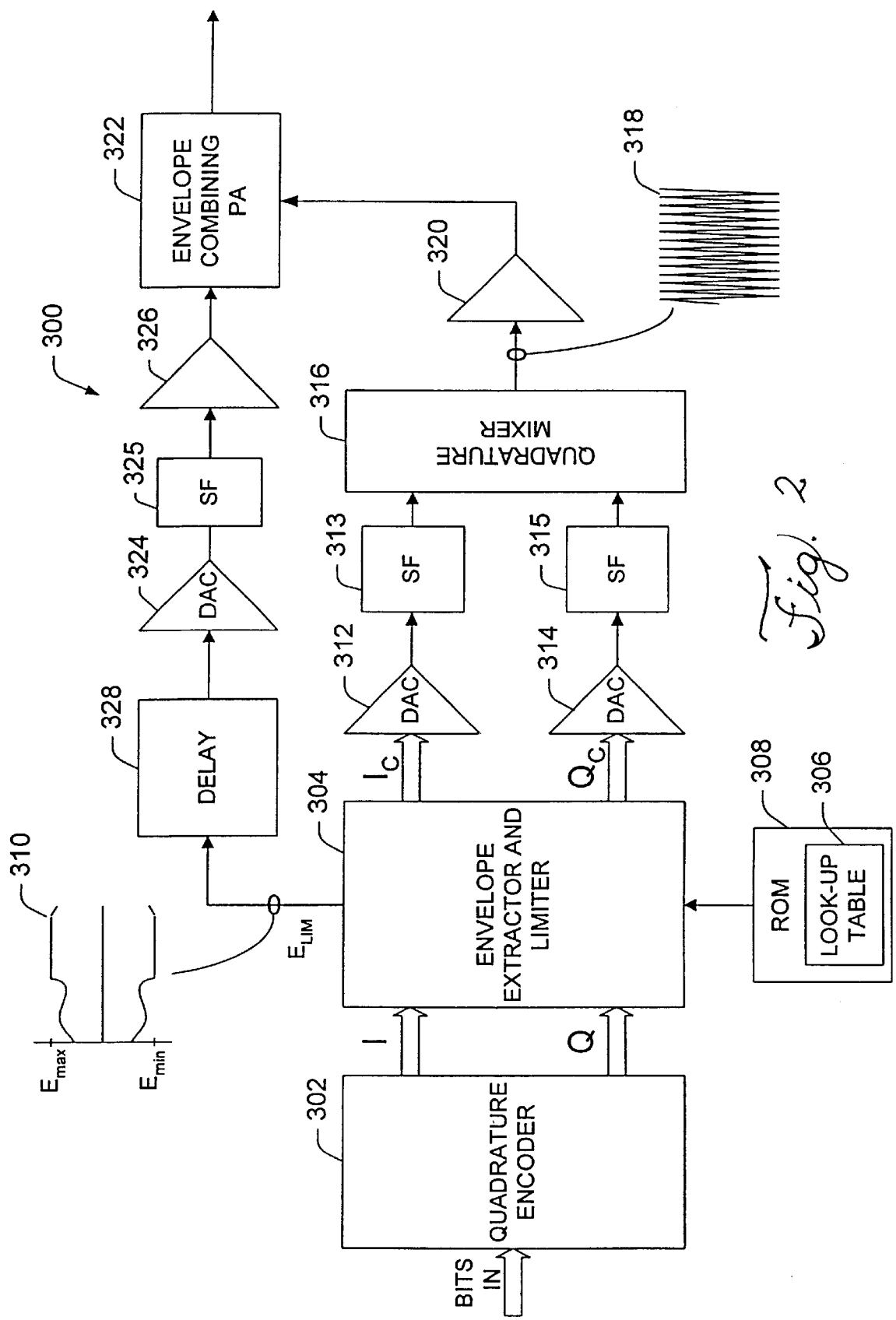
FIG. 2 shows a block diagram of an envelope elimination and restoration amplifier with envelope-limiting.

FIG. 2 shows an envelope elimination and restoration (EER) amplifier 300 that limits the envelope of an incoming signal so that it lies between certain maximum and minimum values ($E_{max}$ and $E_{min}$). The amplifier 300 acts upon digital in-phase (I) and quadrature (Q) inputs provided by a quadrature encoder 302. In the embodiment shown, an envelope extractor and limiter 304 receives the I and Q signals and generates two forms of output: (1) constant envelope in-phase and quadrature signals ($I_C$ and $Q_C$) containing phase and frequency information, and (2) a baseband signal ($E_{lim}$) 310 representing the limited envelope. The limited envelope signal 310 adheres to the following rule:

$E_{min}$, for $E<E_{min}$, $E_{lim}=E$, for $E_{min} \leq E \leq E_{max}$, $E_{max}$, for $E>E_{max}$.

The envelope extractor and limiter 304 produces the limited envelope signal $E_{lim}$ by determining the magnitude of each incoming {I, Q} vector and, for each vector, outputting an envelope value according to the rule above. In particular, the envelope extractor and limiter 304 outputs the minimum envelope value ($E_{min}$) if the actual envelope value (E) is less than $E_{min}$; outputs the maximum envelope value ($E_{max}$) if the actual value is greater than $E_{max}$; and outputs the actual envelope value if $E_{min} \leq E \leq E_{max}$. One way to implement the envelope-limiting feature is to provide a look-up table 306 stored in an electronic storage device, such as read only memory (ROM) 308, from which the envelope extractor and limiter 304 retrieves the appropriate value for $E_{lim}$, using the I and Q values or, alternatively, the actual envelope value as a key. Other implementations also exist, including one in which the envelope extractor and limiter 304 includes a programmable processor that calculates the appropriate value for $E_{lim}$ under the direction of an executable program.

Limiting the envelope signal in this manner reduces the dynamic range of the signal and therefore improves the performance of an actual power amplifier. The maximum and minimum envelopes values ($E_{max}$, $E_{min}$) are selected to yield a desired balance of amplifier efficiency, modulation accuracy (μ), and spectra containment (ACPR). Criteria for selecting the maximum and minimum envelope values are discussed in more detail below.

The amplifier 300 also includes digital-to-analog converters 312, 314, followed by analog smoothing filters 313, 315 (interpolators). The DACs 312, 314 receive the constant envelope signals $I_C$, $Q_C$ from the envelope extractor and limiter 304 and produce corresponding analog signals. A quadrature mixer 316 upconverts these signals to form a constant envelope RE signal 318, which passes through one or more optional RF power amplifier stages 320 to an envelope combining amplifier 322.

The limited envelope signal ($E_{lim}$) 310 also passes through a digital-to-analog converter 324, a smoothing filter 325, and one or more optional gain elements 326 before arriving at the envelope combining amplifier 322. The smoothing filter 325 eliminates all harmonics in the envelope signal, including those introduced by the sample-and-hold circuitry in the DAC 324 and by the envelope-limiting function.

In some cases, the limited envelope signal 310 must pass through a delay circuit 328 to ensure proper timing of the signals arriving at the envelope-combining amplifier 322. The envelope-combining amplifier 322 combines, and in some cases further amplifies, the constant envelope RF signal and the limited envelope signal for transmission through an RF antenna. Several implementations of the envelope-combiner 322 are described in U.S. patent application Ser. No. 09/108,628.

In an alternative embodiment, the envelope extractor and limiter 304, the envelope-combining PA 322, and the envelope signal processing components 324, 326, 328 of FIG. 2 are replaced by a single circuit that performs these functions. Instead of providing the signals $E_{lim}$, $I_C$ and $Q_C$ as output, this circuit provides envelope-limited in-phase and quadrature signals $I_L$ and $Q_L$, where $I_L=E_L \cdot \cos(\theta)$, $Q_L=E_L \cdot \sin(\theta)$, $\theta=\tan^{-1}(Q/I)$, and $E_L$ is the limited envelope. In this embodiment, the quadrature mixer 314 provides a limited envelope RF signal instead of the constant envelope RE signal shown in FIG. 2.

Figure 3:
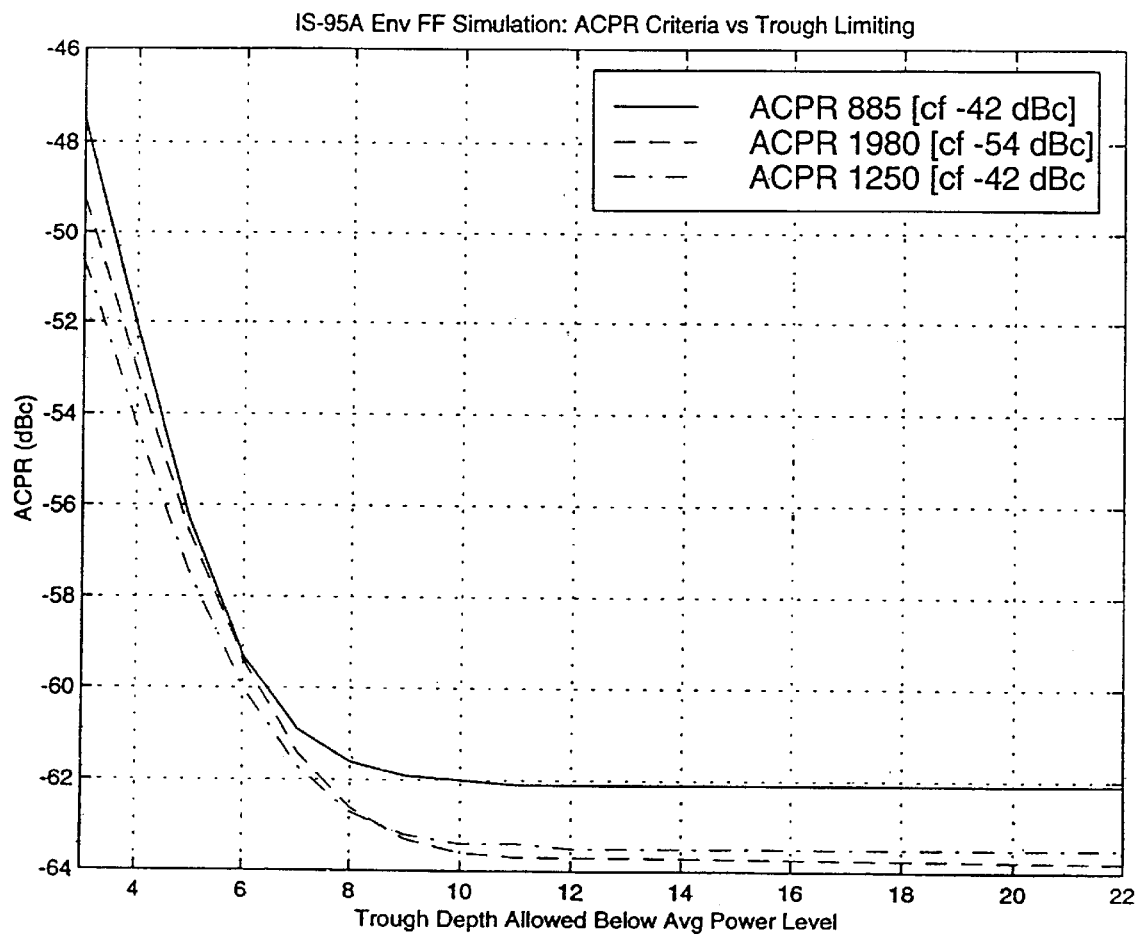
FIG. 3 is an example graph of ACPR vs. Trough Depth for an EER amplifier in an IS-95A system.
Figure 5:
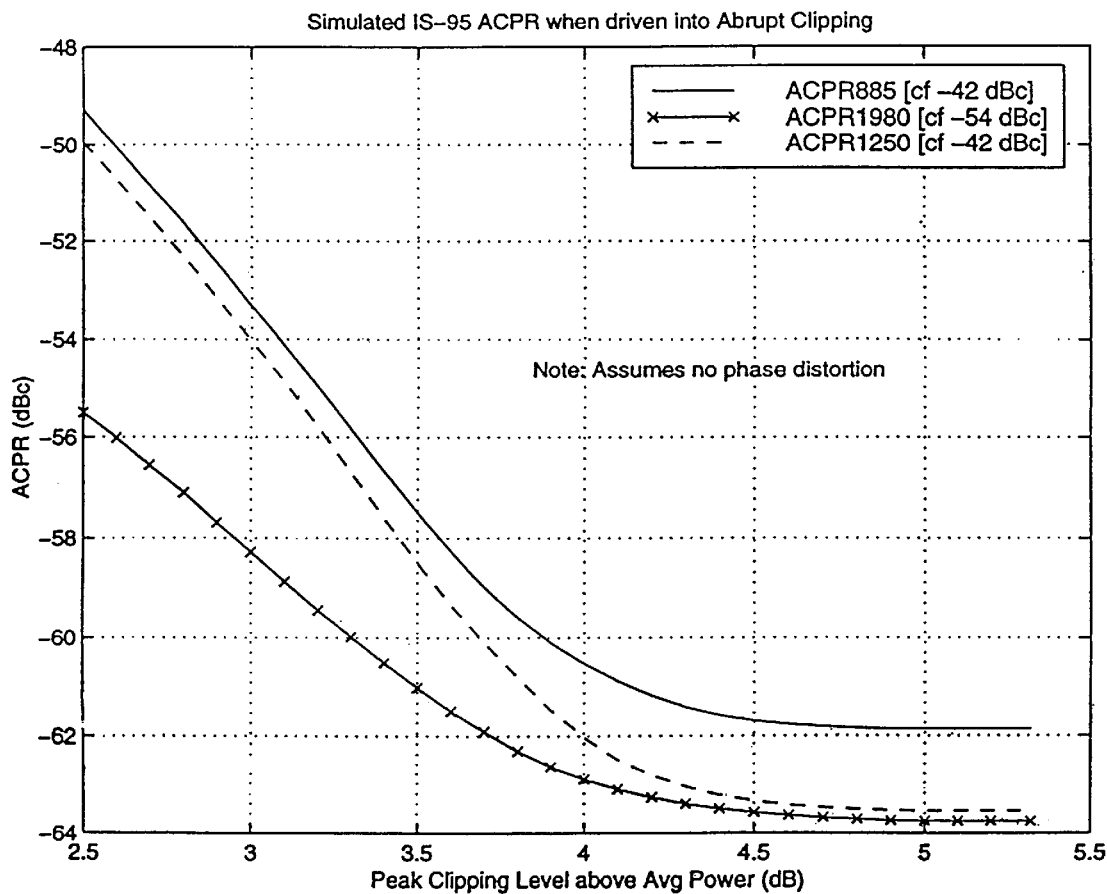
FIG. 5 is an example graph of ACPR vs. Peak Height for an EER amplifier in an IS-95A system.

As discussed above, the maximum and minimum envelope values are determined by balancing the desired amplifier efficiency against the tolerable reductions in modulation accuracy and spectral containment. In general, the envelope values depend on the communication standard that governs the design of the power amplifier. FIG. 3 is a graph showing the relationship between adjacent channel power ratio (ACPR), which indicates the spectral containment of the transmitted signal, and the extent to which the signal's average power level exceeds the minimum envelope power level ("trough depth") in an IS-95A amplifier. This graph shows that limiting the envelope's trough depth to 10 dB below average power has virtually no effect on ACPR, and that limiting the trough depth to 4 dB below average power yields an ACPR of less than −52 dBc. Similar results occur when the envelope peaks are limited in the same manner, as shown in FIG. 5. In particular, limiting the peak height to 3 dB above average power yields an ACPR of less than −52 dBc. Trough limiting prevents the power amplifier from cutting off at low envelope values, which eliminates phase distortion normally caused by the amplifier's failure to cut back on quickly enough. Peak limiting allows the power amplifier to operate at higher output levels (i.e., with less "back off"), which increases amplifier efficiency and which reduces phase distortion since the amplifier itself need not be driven into clipping to improve efficiency.

Figure 4:
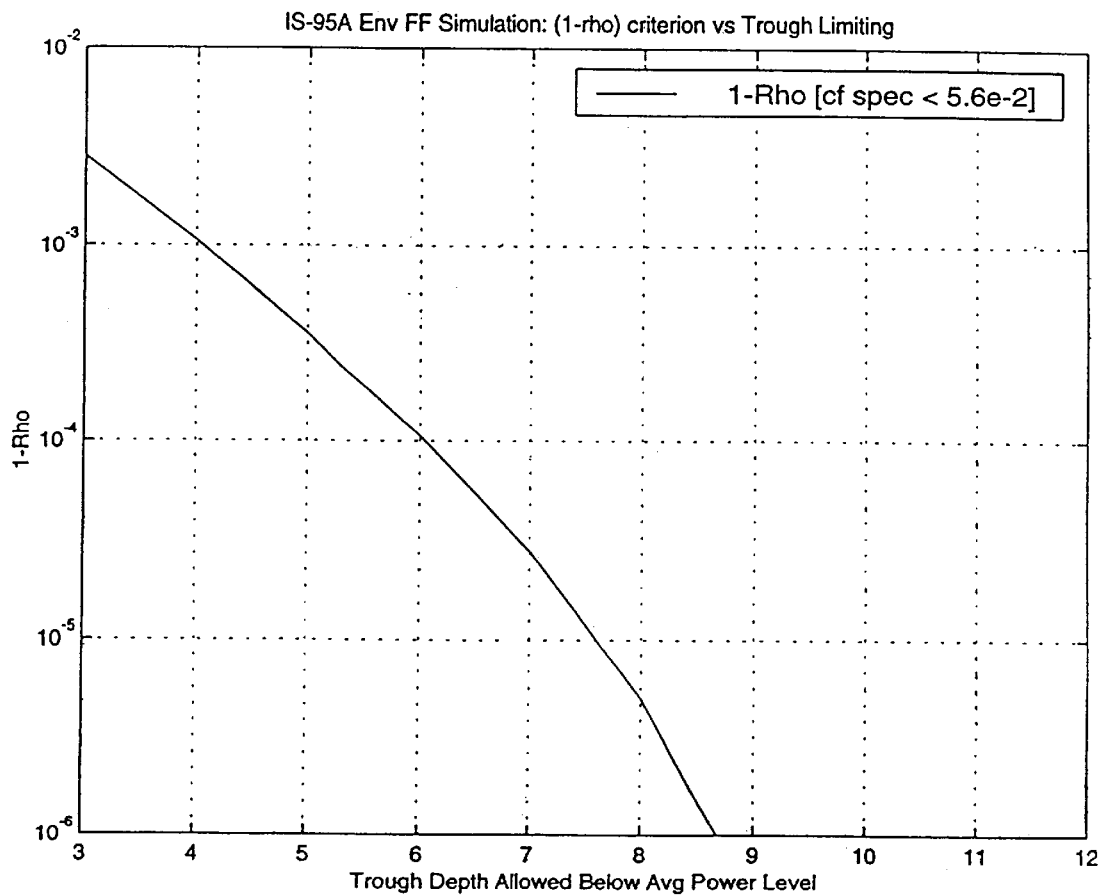
FIG. 4 is an example graph showing 1-ρ for an EER amplifier in an IS-95A system.
Figure 6:
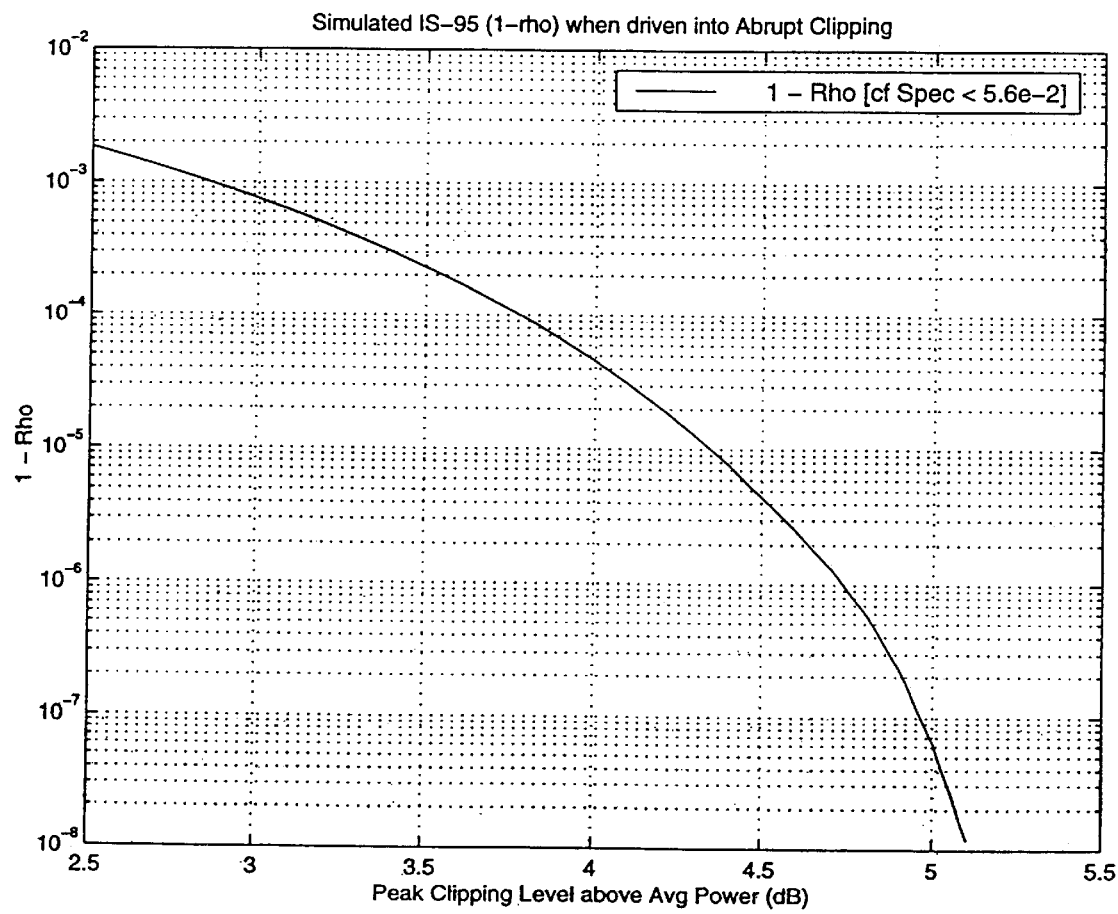
FIG. 6 is an example graph showing 1-ρ for an EER amplifier in an IS-95A system.

FIG. 4 likewise shows the relationship between 1−ρ and trough depth in an IS-95A amplifier, which illustrates the modulation error of the amplifier. The value 1−ρ remains below $10^{-4}$ even for signals limited to a trough depth of 6 dB below average power. FIG. 6 shows that the value 1−ρ remains below $10^{-4}$ for signals limited to a peak height of 4 dB and remains below $10^{-3}$ for signals limited to 3 dB above average power. Therefore, some level of controlled envelope-limiting produces gains in amplifier efficiency without degrading signal and spectral quality.

The envelope-limiting PA avoids phase distortion because the RF amplifier and envelope-combining amplifier stages 320, 322 (FIG. 2) do not themselves limit the signal envelope. In general, these amplifier stages suffer from loss of gain at high input power levels and from phase distortion (i.e., $\theta_{out}/\theta_{in}$ becomes non-constant) at higher output power levels.

Figure 8:
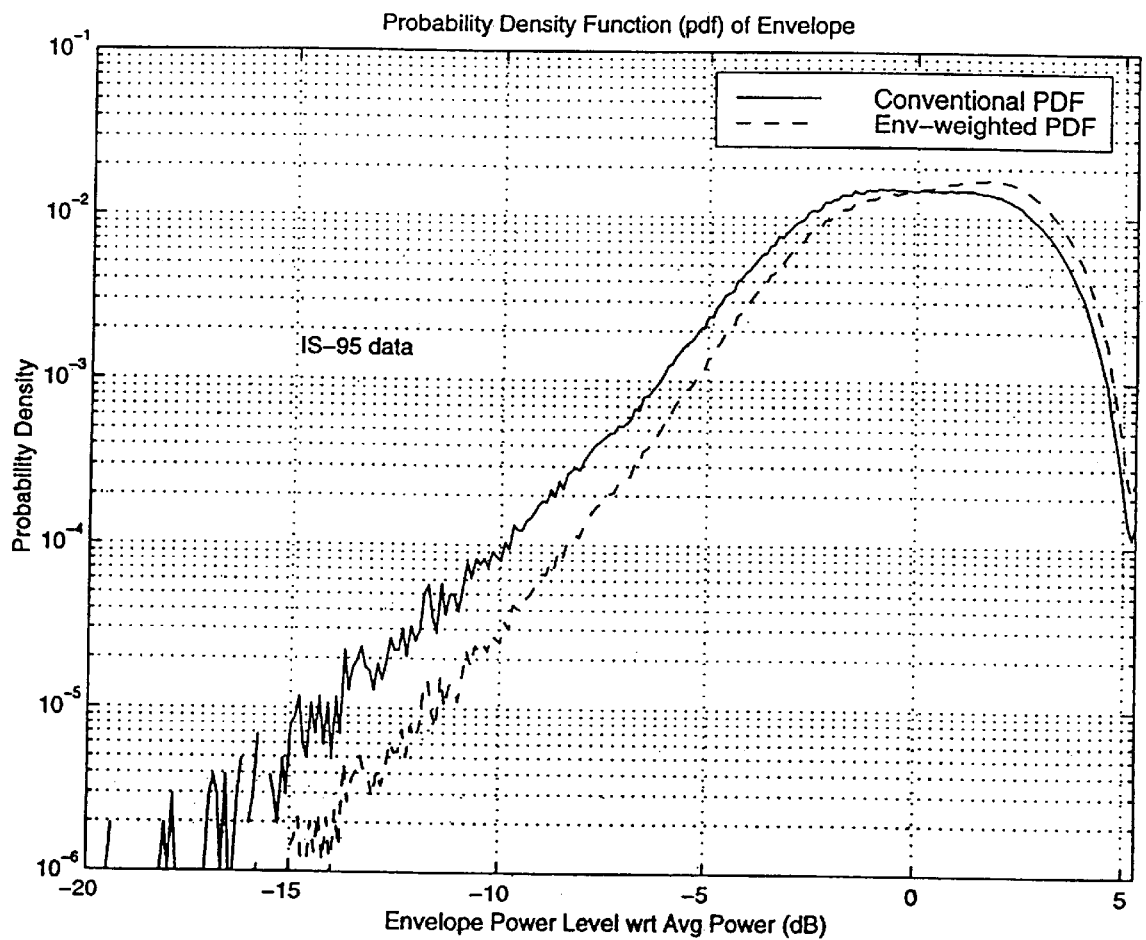
FIG. 8 is a graph showing conventional and weighted probability density functions (PDF) for signals in an IS-95A system.

A constructive technique for selecting the maximum and minimum amplitudes for signal envelopes involves the application of a normalized, weighted probability density function (PDF) corresponding to the particular modulation technique used to encode the signal. The normalized, weighted PDF is derived in a two-step process. First, each envelope level is weighted by its probability of occurrence, which is determined by consulting a previously collected histogram of recorded envelope values for the particular modulation technique, such as IS-95A or PHS (the Japanese "Personal Handyphone System" standard). Second, each weighted probability is normalized by the sum of all weighted probabilities. This process provides a continuum of values, indexed by envelope power level, that integrates to a value of one. For most digital modulation techniques, clipping the signal envelope to truncate portions with a total cumulative probability of approximately 1.0% or less has no noticeable effect on signal accuracy and spectral containment. FIG. 8 shows the probability density function and envelope-weighted PDF for an example IS-95A system.

Figure 7A:
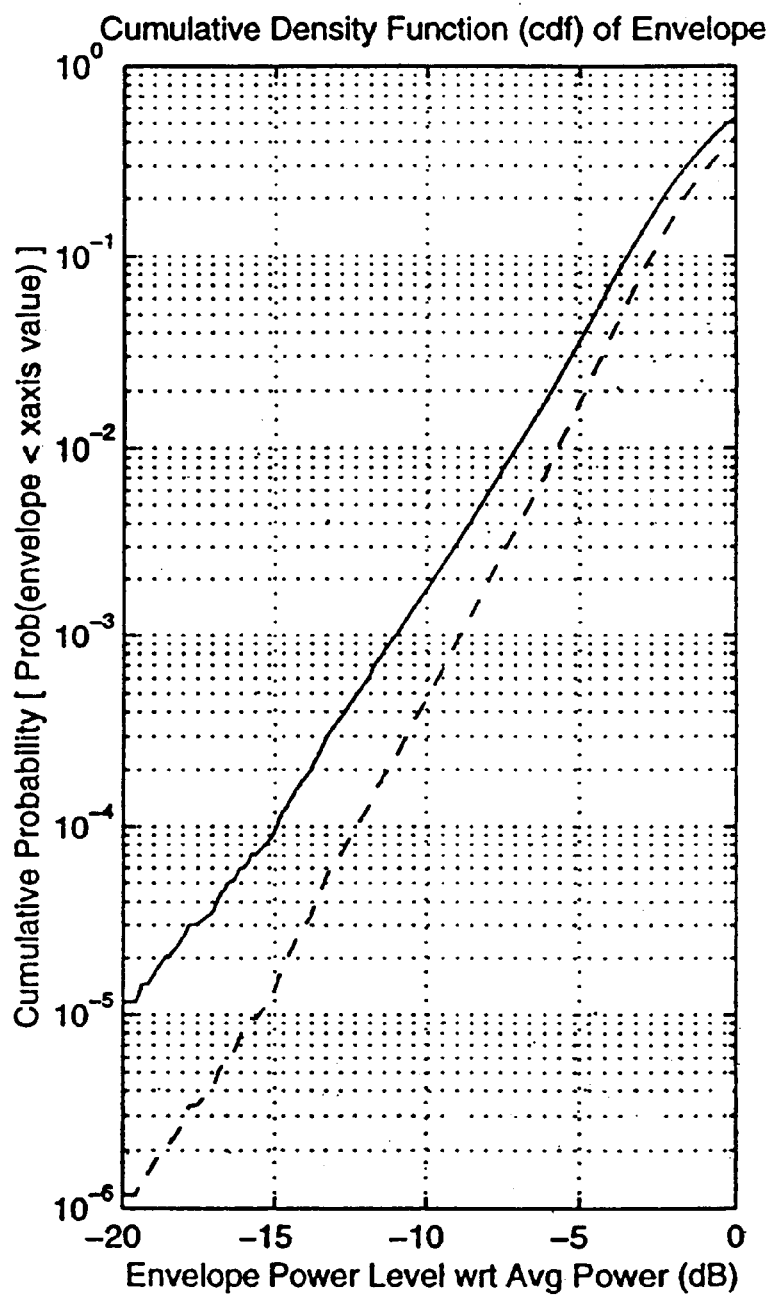
FIGS. 7A and 7B are graphs showing conventional and envelope weighted cumulative density functions (CDF) and 1-CDF for signals in an IS-95A system.
Figure 7B:
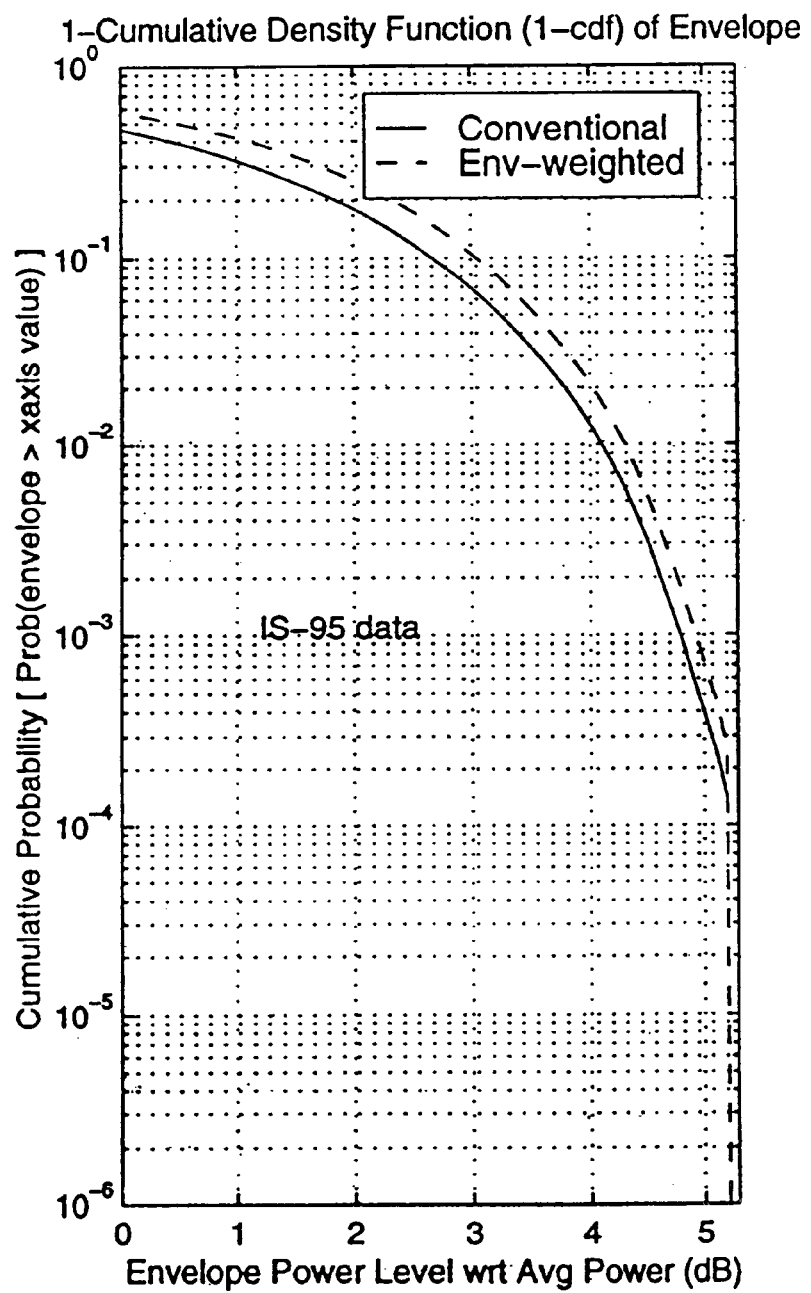

FIGS. 7A and 7B illustrate cumulative probability distributions by which the peak and trough clipping levels of an example IS-95A system can be determined. For trough clipping, a conventional cumulative distribution function of the normalized, weighted envelope levels is used, because the left tail probability determines the significance of troughs below a certain trough clipping level (FIG. 7A). For peak limiting, one minus this cumulative density is used, because the right tail probabilities are of interest when determining whether peaks above a certain power level are statistically significant (FIG. 7B). The envelope level is weighted because measures of modulation accuracy and distortion are most heavily influenced by high power levels. For example, a 1% error for a 100 mW sample is more important than a similar error for a 1 mW sample when the cumulative errors are averaged over the total number of samples. Weighting the envelope levels allows direct assessment of the impact of such samples in a least squares modulation accuracy analysis.

FIG. 7A shows a 0.01 probability that envelope excursions beyond −6 dB will occur and a 0.001 probability that excursions beyond −9 dB will occur. Likewise, FIG. 7B shows a 0.01 probability that envelope excursions above 4 dB will occur and a 0.001 probability that excursions above 5 dB will occur. The minimum and maximum envelope values are selected by determining what percentage of envelope values one is willing to exclude and then finding the corresponding relative power levels, as shown in FIGS. 7A and 7B. By consulting the information shown in FIGS. 3 through 6, one can then determine how the selected minimum and maximum envelope values will affect modulation accuracy and spectral containment.

Figure 9:
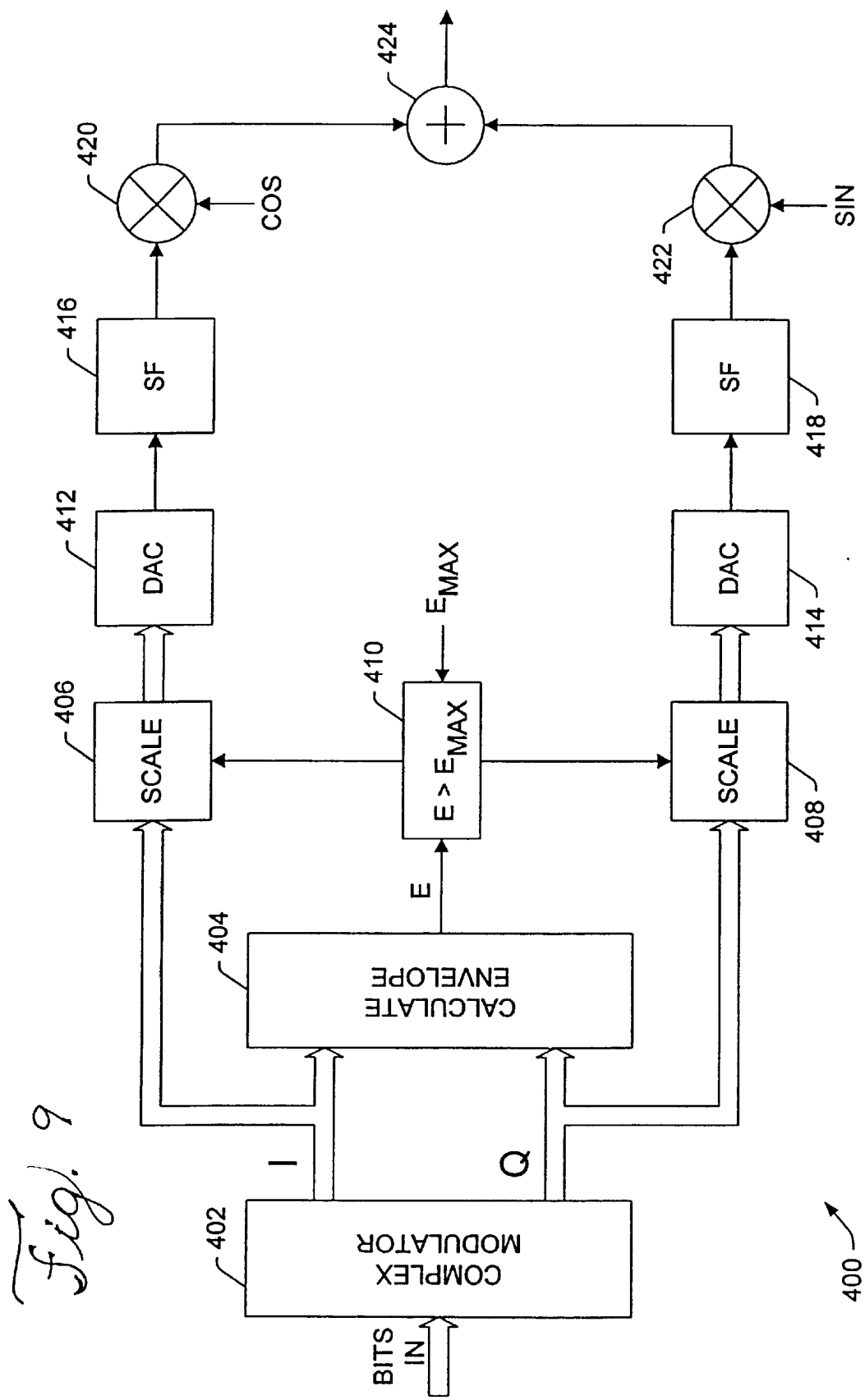
FIG. 9 shows a block diagram of an otherwise conventional power amplifier that includes envelope peak and trough limiting.

FIG. 9 illustrates one technique for applying envelope peak and trough limiting to an otherwise conventional power amplifier (PA) 400. The PA 400 includes a complex modulator 402 that receives digital data and converts the data into two signals representing an in-phase component (I) and a quadrature component (Q) of a baseband signal. The complex modulator 402 delivers the I and Q signals to a processing circuit 404 that calculates the envelope (E) of the baseband signal for each pair of pulses in the I and Q signals. The complex modulator 402 also delivers the I and Q signals to two scaling elements 406, 408, which limits the envelopes of the I and Q signals by scaling the pulses in these signals, as described below.

A digital comparator 410 receives the envelope value E from the processing circuit 404 and one or more threshold values ($E_{MAX}$, $E_{MIN}$) from a storage device, such as read only memory (ROM). The comparator 410 compares the envelope value E to the threshold values. If the envelope value E lies between the threshold values ($E_{MIN} \leq E \leq E_{MAX}$), the comparator instructs the scaling elements to apply a scale factor of 1, so that the envelope of the baseband signal retains its true value. If, on the other hand, the envelope value E lies below the lower threshold value $E_{MIN}$ or above the maximum threshold value $E_{MAX}$, the comparator instructs the scaling elements to apply a scale factor of $E_{MIN}/E$ or $E_{MAX}/E$, respectively. This ensures that all excursions of the baseband signal beyond the minimum and maximum envelope values are clipped to these values.

The envelope-limited signals I', Q' produced by the scaling elements 406, 408 pass through digital-to-analog converters (DACs) 412, 414 and through smoothing filters 416, 418. Two mixer elements 420, 422 upconvert and amplify the I' and Q' signals, and a combiner 424 combines the signals to form an envelope-limited RF signal ready for transmission.

A number of embodiments of the present invention have been described. Nevertheless, it will be understood that various modifications may be made without departing from the spirit and scope of the invention. For example, in some implementations of the digital amplifier, the envelope extractor and limiter converts the incoming signal from rectangular coordinates (I, Q) to polar coordinates (E, θ) before producing the limited envelope signal. Also, in some implementations, the envelope extracting and the envelope-limiting functions are performed by separate electronic components. The invention also is useful in other applications, including line drivers for cable and telephone wires, SSB communication systems, and satellite links. Accordingly, other embodiments are within the scope of the following claims.

What is claimed is:

1. A method for use in amplifying a non-constant envelope signal, the method comprising:
   (a) separating the signal into two component signals, including:
      (1) a constant envelope signal containing phase and frequency information; and
      (2) a baseband signal representing the envelope;
   (b) limiting the baseband signal to magnitudes lying either above or below a predetermined boundary value;
   (c) amplifying at least one of the component signals; and
   (d) combining the magnitude-limited baseband signal and the constant envelope signal to form an output signal having a limited but non-constant envelope.

2. The method of claim 1, wherein limiting the baseband signal includes limiting all portions of the baseband signal that lie above the boundary value to the boundary value.

3. The method of claim 2, further comprising receiving digital data indicating an actual value of the baseband signal and, if the actual value is greater than the boundary value, replacing the actual value with the boundary value.

4. The method of claim 1, wherein limiting the baseband signal includes limiting all portions of the baseband signal that lie below the boundary value to the boundary value.

5. The method of claim 4, further comprising receiving digital data indicating an actual value of the baseband signal and, if the actual value is less than the boundary value, replacing the actual value with the boundary value.

6. The method of claim 1, further comprising receiving digital signals representing in-phase and quadrature components of the non-constant envelope signal.

7. The method of claim 6, further, comprising calculating a magnitude for the baseband signal based on the values of the in-phase and quadrature components.

8. The method of claim 1, wherein amplifying at least one of the component signals includes amplifying the limited baseband signal.

9. A power amplifier for use in amplifying a non-constant envelope signal, the amplifier comprising:
   (a) an envelope extractor that divides the non-constant envelope signal into two component signals:
      (1) a constant envelope signal containing phase and frequency information; and
      (2) a baseband signal representing the envelope;
   (b) an envelope limiter that limits the baseband signal to magnitudes lying either above or below a predetermined boundary value;
   (c) amplification circuitry that amplifies at least one of the component signals; and
   (d) an envelope combiner that combines the magnitude-limited baseband signal and the constant envelope signal to form an output signal having a limited but non-constant envelope.

10. The amplifier of claim 9, wherein the envelope limiter limits all portions of the baseband signal that lie above the boundary value to the boundary value.

11. The amplifier of claim 10, wherein the envelope limiter is configured to receive digital data indicating an actual value of the baseband signal and, if the actual value is greater than the boundary value, to output the boundary value in place of the actual value.

12. The amplifier of claim 11, wherein the envelope limiter limits all portions of the baseband signal that lie below the boundary value to the boundary value.

13. The amplifier of claim 12, wherein the envelope limiter is configured to receive digital data indicating an actual value of the baseband signal and, if the actual value is less than the boundary value, to output the boundary value in place of the actual value.

14. The amplifier of claim 9, ether comprising a quadrature encoder that provides digital signals representing in-phase and quadrature components of the non-constant envelope signal.

15. The amplifier of claim 14, wherein the envelope extractor is configured to calculate a magnitude for the baseband signal based on the values of the in-phase and quadrature components.

16. The amplifier of claim 9, wherein the amplification circuitry is configured to amplify the magnitude-limited baseband signal.

17. The amplifier of claim 9, wherein the envelope extractor, the envelope limiter, and the envelope combiner together comprise a single circuit configured to:
   (a) receive input signals representing in-phase (I) and quadrature (Q) components of the non-constant envelope signal; and
   (b) provide output signals representing limited envelope in-phase ($I_L$) and quadrature ($Q_L$) components of the output signal.

18. A method for use in limiting the envelope of a non-constant envelope signal, the method comprising:
   (a) receiving signals representing in-phase (I) and quadrature (Q) components of the non-constant envelope signal;
   (b) for at least one pair of samples in the I and Q signals, calculating an envelope value for the non-constant envelope signal;
   (c) comparing each envelope value to at least one threshold value; and
   (d) if the envelope value exceeds the threshold value, scaling the I and Q signals so that the envelope value does not exceed the threshold value.

19. The method of claim 18, wherein scaling the I and Q signals includes scaling the signals so that the envelope value equals the threshold value.

20. The method of claim 18, wherein comparing each envelope value to a threshold value includes determining whether the envelope value is less than a minimum value.

21. The method of claim 18, wherein comparing each envelope value to a threshold value includes determining whether the envelope value is greater than a maximum value.

22. The method of claim 18, further comprising calculating the threshold value based on a weighted cumulative density function.

23. The method of claim 22, wherein calculating the threshold value includes establishing the threshold value such that the probability that the envelope value will exceed the threshold value is less than a predetermined amount.

24. The method of claim 23, wherein the predetermined amount is between about 0.01 and 0.001.

25. The method of claim 23, wherein the predetermined amount is about 0.01.

26. The method of claim 18, wherein scaling the I and Q signals includes scaling the signals by a factor that equals the threshold value divided by the envelope value.

* * * * *